(12) United States Patent
Simonnet

(10) Patent No.: US 6,479,841 B1
(45) Date of Patent: Nov. 12, 2002

(54) POWER COMPONENT STATE DETECTOR

(75) Inventor: Jean-Michel Simonnet, Veretz (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/705,113

(22) Filed: Nov. 2, 2000

(30) Foreign Application Priority Data

Nov. 3, 1999 (FR) ............................................. 99 14011

(51) Int. Cl.[7] .................. H01L 29/00; H01L 29/74; H01L 31/111
(52) U.S. Cl. .................. 257/146; 257/162; 257/504
(58) Field of Search ............................... 257/328, 302, 257/162, 146, 499, 504

(56) References Cited

U.S. PATENT DOCUMENTS

| | | | |
|---|---|---|---|
| 5,036,377 A | 7/1991 | Pathak et al. | 357/38 |
| 5,442,219 A | 8/1995 | Kato | 257/370 |
| 5,699,008 A | 12/1997 | Pezzani | 327/438 |
| 5,889,374 A | 3/1999 | Pezzani | 318/254 |
| 6,017,778 A * | 6/2000 | Pezzani | 438/138 |
| 6,075,277 A | 6/2000 | Pezzani | 257/499 |
| 6,252,257 B1 * | 6/2001 | Duclos et al. | 257/119 |

FOREIGN PATENT DOCUMENTS

| | | | |
|---|---|---|---|
| EP | A-0 817 277 | 1/1998 | H01L/29/747 |
| EP | A-0 881 672 | 12/1998 | H01L/21/761 |
| EP | A-0 987 751 | 3/2000 | H01L/21/761 |
| FR | A-2 773 021 | 6/1999 | H03K/17/72 |

OTHER PUBLICATIONS

French Search Report from French Patent Application 99 14011, filed Nov. 3, 1999.

* cited by examiner

Primary Examiner—Michael Sherry
Assistant Examiner—Evan Pert
(74) Attorney, Agent, or Firm—Wolf, Greenfield & Sacks, P.C.

(57) ABSTRACT

A detector of the state (on or off) of a vertical power component formed in a lightly-doped semiconductor substrate of a first conductivity type having a front surface and a rear surface. The region corresponding to the power component is surrounded with an isolating wall of opposite type to that of the substrate. This state detector is formed outside of said region and is formed with a vertical detection component, the state of which is switched by parasitic charges propagating outside of the isolating wall when the power component is on.

14 Claims, 3 Drawing Sheets

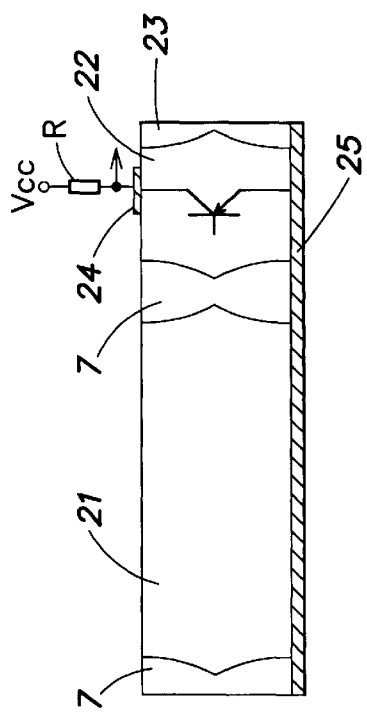
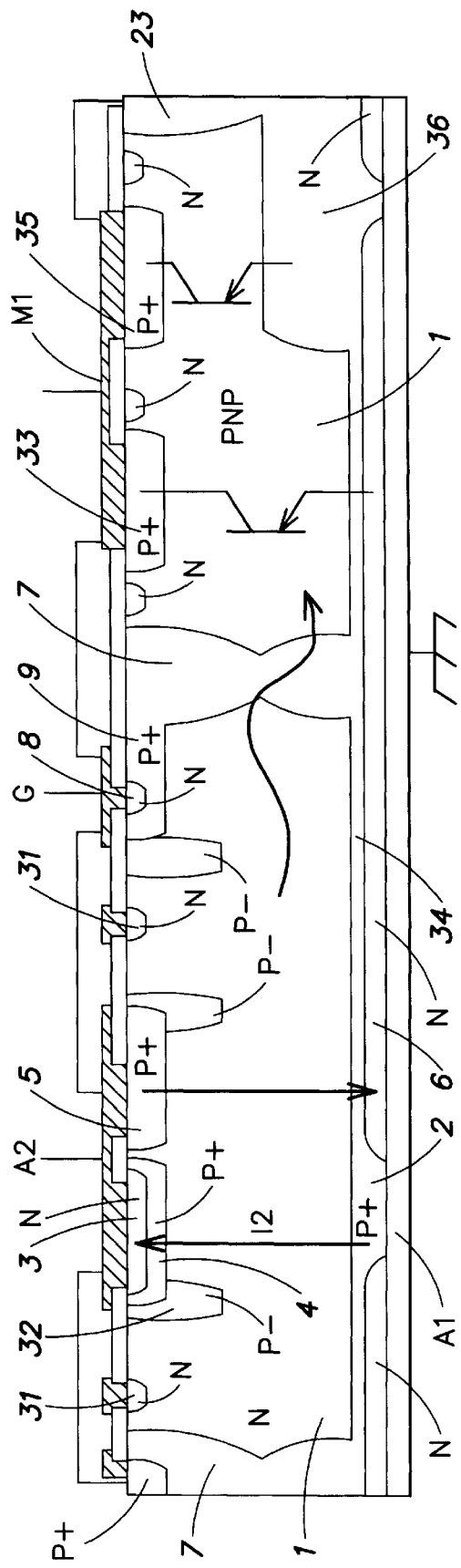
FIG. 4
FIG. 5

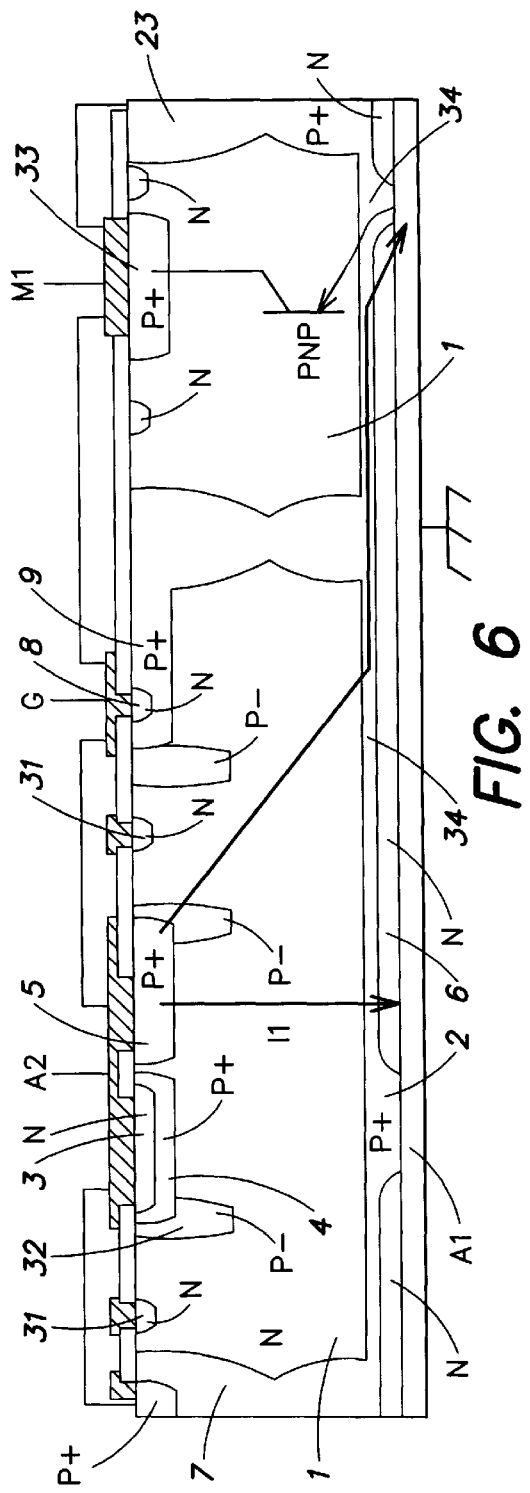
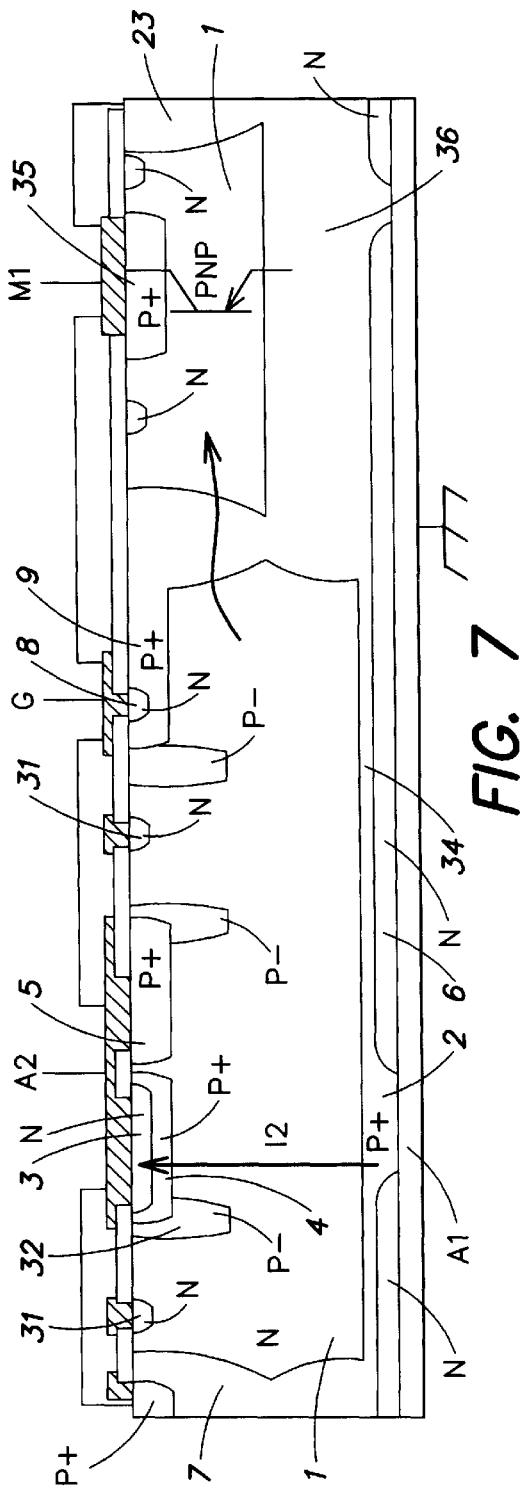
FIG. 6
FIG. 7

POWER COMPONENT STATE DETECTOR

BACKGROUND OF THE INVENTION

1. Field of the Invention

The present invention relates to the implementation, in monolithic form, of a detector of the state (on or off) of a power component. The present invention especially applies to a state detector for a medium power bidirectional ACS™ type switch which will be described hereafter.

2. Discussion of the Related Art

The most currents static bidirectional switches are triacs. A triac corresponds to the antiparallel association of two thyristors. It can thus be directly connected in an A.C. network, for example, the mains. The gate of a conventional triac corresponds to the cathode gate of at least one of the two thyristors forming it and is referenced to the electrode located on the front surface of this triac, that is, the surface that includes the gate terminal, while the other triac surface is typically connected to a heat sink and to the ground. This complicates the control circuits.

So-called ACS™ bidirectional switches are, for example, described in U.S. Pat. No. 6,034,381, the disclosure of which is hereby incorporated by reference. The triggering of an ACS™ is ensured by the application of a voltage between a control electrode located on the front surface of the component and a main electrode located on the opposite surface of the component, typically grounded.

FIG. 1 shows the equivalent electric diagram of an ACS™-type bidirectional switch. A control electrode G of the bidirectional switch is connected to the emitter of a bipolar transistor T, the collector of which is connected the anode gates of first and second thyristors Th1 and Th2 placed in antiparallel between two terminals A1 and A2. Terminal A1 corresponds to the anode of thyristor Th1 and to the cathode of thyristor Th2. Terminal A1 is also connected to the base of transistor T. Terminal A2 corresponds to the anode of thyristor Th2 and to the cathode of thyristor Th1.

FIG. 2 is a simplified cross-section view of an example of a monolithic embodiment of an ACS™. Transistor T is formed in the left-hand portion of the drawing, thyristor Th1 at the center, and thyristor Th2 to the right thereof.

The structure of FIG. 2 is formed from an N-type lightly-doped semiconductor substrate 1. The anode of thyristor Th1 corresponds to a P-type layer 2 that is formed on the rear surface side of substrate 1. Its cathode corresponds to an N-type region 3 formed on the front surface side in a P-type well 4. The anode of thyristor Th2 corresponds to a P-type well 5 formed on the front surface side and its cathode corresponds to an N-type region 6 formed on the rear surface side in layer 2. The periphery of the structure is formed of a heavily-doped P-type isolating wall 7 extending from the front surface to P-type layer 2. Conventionally, wall 7 is obtained by deep diffusions from the two substrate surfaces. The rear surface is coated with a metallization Ml corresponding to first terminal A1 of the bidirectional switch. The upper surfaces of regions 3 and 5 are coated with a second metallization M2 corresponding to second terminal A2 of the bidirectional switch. An N-type region 8 is formed, on the front surface side, in a P-type well 9 in contact with peripheral region 7. The surface of region 8 forms one piece with a metallization M3 connected to control terminal G of the bidirectional switch. A metallization M4 may be formed on the upper surface of peripheral region 7. Metallization M4 is not connected to any external terminal. As an alternative, well 9 may be separated from peripheral region 7 and electrically connected thereto via metallization M4.

The operation of this bidirectional switch is the following.

When terminal A2 is negative with respect to terminal A1, thyristor Th1 can be turned on. If a sufficiently negative voltage with respect to metallization M1 is applied to terminal G, the base-emitter junction of transistor T is forward biased and this transistor turns on. A vertical current ic shown in dotted lines in FIG. 2 thus flows from metallization M1, through the forward junction between layer 2 and substrate 1, then into regions 1, 9, and 8 corresponding to transistor T. Carriers are thus generated at the level of the junction between substrate 1 and well 9 near the junction between substrate 1 and well 4, and thyristor Th1 is turned on. It can also be considered that an auxiliary vertical NPNP thyristor including regions 8-9-1-2, region 9 of which forms the cathode gate region, has been triggered.

When terminal A2 is positive with respect to terminal A1, the applying of a negative voltage on terminal G turns on transistor T. The carriers present in the vicinity of the junction between substrate 1 and layer 5 turn on thyristor Th2.

Various alternative embodiments of an ACS™ switch are described in U.S. patent application Ser. Nos. 09/634,076 and 09/634,077 by the applicant and incorporated hereby by reference. For example, as shown in FIG. 3, an N-type region 10 is added to improve the control responsiveness.

SUMMARY OF THE INVENTION

An object of the present invention is to provide an embodiment, in monolithic form, of a power component associated with a state (on or off) detector.

Another object of the present invention is to provide such a state detector associated with an ACS™ switch.

To achieve these and other objects, the present invention provides a detector of the state (on or off) of a vertical power component formed in a lightly-doped semiconductor substrate of a first conductivity type having a front surface and a rear surface, in which the region corresponding to the power component is surrounded with an isolating wall of opposite conductivity type to that of the substrate. This state detector is formed outside of said region and is formed with a vertical detection component, the state of which is switched by parasitic charges propagating outside of the isolating wall when the power component is on.

According to an embodiment of the present invention, the state detector is formed of a vertical transistor, the substrate of which forms the base.

According to an embodiment of the present invention, the vertical transistor includes, on its lower surface side, a diffused region formed at the same time as the diffusion of the lower surface isolating wall.

According to an embodiment of the present invention, the state detector includes several distinct vertical transistors, the emitter regions of which, formed on the lower surface side of the substrate, have distinct diffusion depths.

According to an embodiment of the present invention, the rear surface of the semiconductive layer including the power component and the detection component is coated with a metallization connected to a reference potential.

According to an embodiment of the present invention, a front surface metallization of the detection component is connected to a voltage which is fixed with respect to the reference voltage.

The foregoing objects, features and advantages of the present invention, will be discussed in detail in the following non-limiting description of specific embodiments in connection with the accompanying drawings.

BRIEF DESCRIPTION OF THE DRAWINGS

FIG. 4 very schematically shows the general structure of a detector according to the present invention;

FIG. 5 shows an embodiment of the present invention adapted to the detection of the on or off state of an ACS™ switch; and FIGS. 6 and 7 show partial views of the diagram of FIG. 5 intended for explaining the operation of a specific embodiment of the present invention.

DETAILED DESCRIPTION

Figure 1:
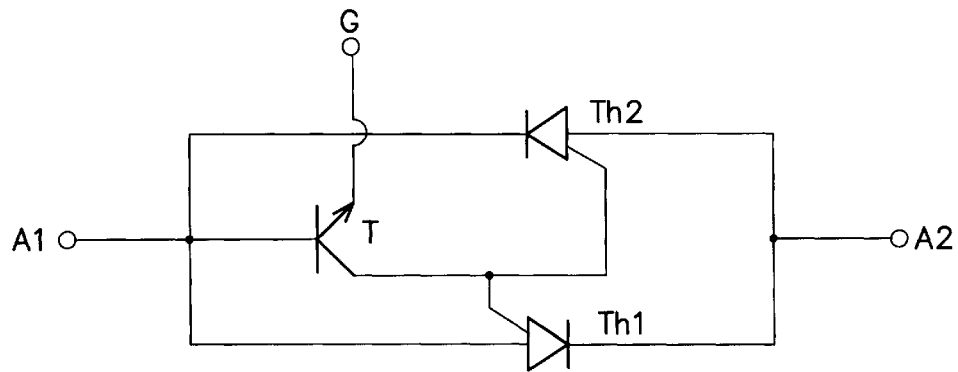
FIG. 1 is schematic diagram of an ACS™ bidirectional switch.
Figure 2:
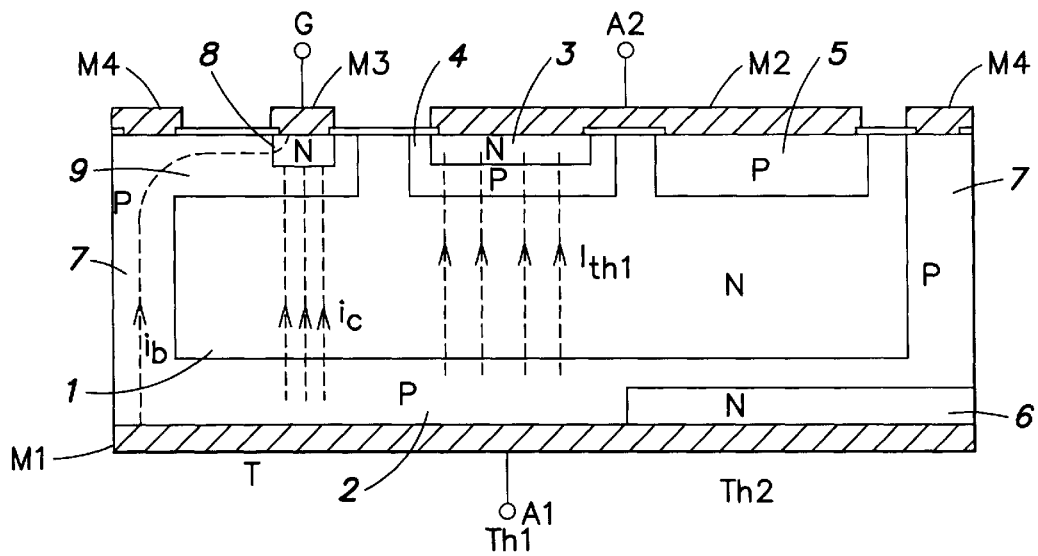
FIG. 2 shows a simplified cross-section view of an embodiment of the bidirectional switch of FIG. 1.
Figure 3:
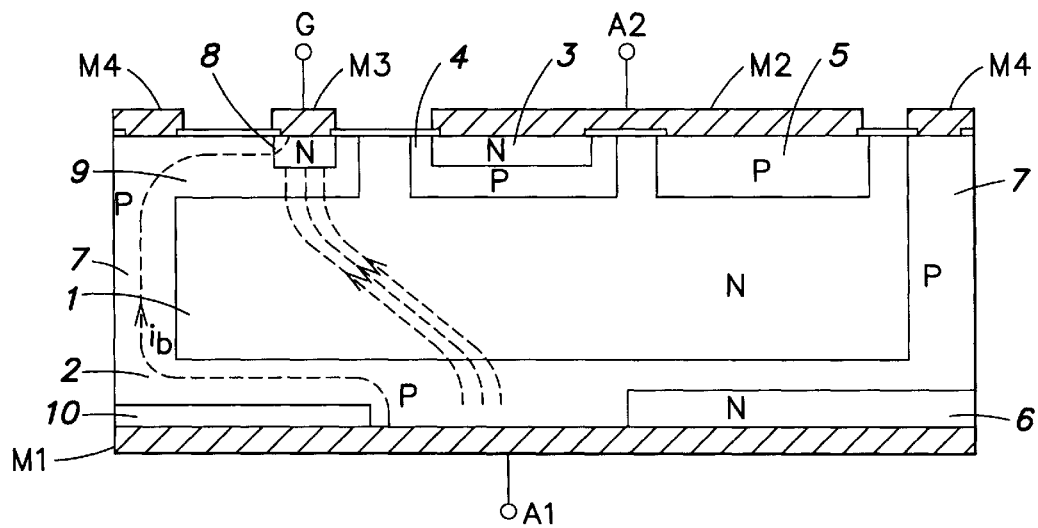
FIG. 3 is a simplified cross-section view of an alternative embodiment of the switch of FIG. 1.

In the various drawings, same references designate similar or identical elements. Further, as usual in the representation of semiconductor components, FIGS. 2–7 are not to scale.

Generally, in the field of power components, the knowledge of the on or off state of a power switch is of the utmost importance. External components can then be controlled, or their operation can be forbidden. Such a detection is for example useful to become aware of an incidental turning-on of a power component due to parasitic signals, or in the case where a power component is damaged and remains on while it has been controlled to the off state. This detection can also be used to detect the switching of a protection component to activate a complementary protection, for example, a series switch, or to perform an analysis of incidents.

Usually, to perform such a detection, a resistor of small value and high current carrying capacity is inserted in the series circuit of the power component. The potential difference across this resistor indicates the on or off state of the switch. This resistor, which is submitted to high stress, is expensive, can be bulky and is generally provided in the form of a discrete component external to the integrated power circuit incorporating the power component.

The present invention takes advantage of an observation made by the applicant and described in U.S. patent application Ser. No. 09/081,051 and incorporated herein by reference according to which, when a power component is surrounded with an isolating wall, if a conventionally formed isolating wall such that the concentration of dopant atoms in the median area of the isolating wall is relatively low is used, a static isolation, but no dynamic isolation, is ensured between neighboring components. Thus, charge carriers generated in the area of the power component surrounded with the isolating wall when a high current flows therethrough spread into the neighboring areas despite the existence of this isolating wall when a high current crosses the power component.

The present invention aims at taking advantage of this defect by arranging, outside of an isolating wall surrounding a power component of vertical type, a vertical detection component capable of being turned on by the parasitic carriers generated outside of the isolating wall by the turning-on of the power component. This detection component is turned on or off according to the state of the main component and the state of the detection component reveals the state of the main component.

This general aspect of the present invention is illustrated in FIG. 4 that shows a portion of a semiconductor wafer including a lightly-doped substrate. An isolating wall 7 delimits a portion 21 of the substrate in which are formed, from the lower and upper surfaces, various layers (not shown) intended for forming a power component. As described in the above-mentioned United States patent application, when the power component is run through by a relatively high current, a conventional isolating wall 7 is crossed by charge carriers that diffuse in an area 22 of the substrate external to wall 7 and preferably delimited by an isolating wall 23. As shown, area 22, for example, includes a vertical component having a first terminal connected to a front surface metallization 24 and a second terminal connected to a rear surface metallization 25. This component, as will be seen hereafter, is for example of transistor type and the carrier generation in the region corresponding to its base turns it on. If a voltage is applied between terminals 24 and 25, this turning-on can be detected by any conventional means. For example, metallization 24 is connected to a low voltage supply source VCC via a resistor of high value R. Thus, when the transistor is off, metallization 24 is substantially at voltage VCC whereas, when the transistor is on, metallization 24 is substantially grounded (at the potential of the rear surface of the power component).

FIG. 5 shows as an example an application of the present invention to the detection of the turning-on of an ACS™-type component such as previously described. In FIG. 5, analogous references to those of FIG. 3 will be used to designate similar regions or layers.

The power component is formed in a substrate 1 delimited by an isolating wall 7. Between a main electrode metallization A2 arranged on the upper surface side and a lower surface metallization are arranged a first thyristor including regions 3 and 4, substrate 1, and a P+-type region 2, and a second thyristor including a P-type region 5, substrate 1, P+ region 2, and an N+ region 6. A triggering electrode G forms one piece with an N+-type region 8 connected by a P-type region 9 to isolating wall 7. Channel stop regions 31 arranged on the upper surface side and lightly-doped diffused P-type regions 32 arranged at the external periphery of upper surface P-type regions 4, 5, and 9 to improve the current withstand of the component have also been shown.

Outside of isolating wall 7 is arranged a detection component formed in FIG. 5 of the parallel association of two vertical PNP transistors between an upper surface metallization M1 and a lower surface metallization A1. The first vertical PNP transistor includes a P-type region 33, substrate 1 and an extension 34 of previously-described P-type region 2. Although this does not appear from the cross-section view of FIG. 5, a portion of P-type region 34 is in contact with lower surface electrode A1. The second PNP transistor includes a P-type region 35, substrate 1, and a deep P-type region 36 formed at the same time as the lower surface isolating walls.

FIGS. 6 and 7 show portions of the circuit of FIG. 5.

FIG. 6 relates to the case where main upper surface electrode A2 is positive with respect to lower surface electrode A1. In this case, a current I1 flows through the thyristor including regions 5-1-2-6. However, all current I1 does not flow to region 1 but a portion of this current continues to the outside of the isolating wall, along P-type region 2 towards P-type region 34 and causing the diffusion of carriers in the portion of substrate 1 arranged outside of isolating wall 7. If a positive or negative voltage is applied to metallization M1 of the detection transistor, this detection transistor then turns on and this on-state can be detected.

FIG. 7 illustrates the case where lower surface electrode A1 is positive with respect to upper surface electrode A2. In this case, a current 12 flows as shown through thyristor 2-1-4-3. Then, in accordance with what has been discussed in the above-mentioned U.S. patent application Ser. No. (09/081,051), charges cross the isolating wall and penetrate outside thereof into the region corresponding to the base of PNP transistor 35-1-36.

Experimental studies and simulations have proven that the PNP transistor structures respectively shown in FIGS. 6 and 7 are better adapted to being triggered in each of the considered cases.

Of course, the present invention is likely to have various alterations, modifications, and improvements which will readily occur to those skilled in the art.

In particular, the detection transistor according to the present invention may be replaced with another element likely to be triggered when a current flows through a well containing a main power structure.

Further, although the case where the main structure is an ACS™-type component has been described in detail in relation with FIGS. 5, 6, and 7, the present invention applies to the detection of the flowing of a current in any other main power component, for example a mere diode, a uni- or bidirectional protection component, a power transistor, or other.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A state detector that detects an on or off state of a vertical power component formed in a lightly-doped semiconductor substrate of a first conductivity type having a front surface and a rear surface, in which a region corresponding to the vertical power component is surrounded with an isolating wall of opposite type to that of the substrate, the state detector being formed outside of said region and being formed with a vertical detection component, the state of which is switched by parasitic charges propagating outside of the isolating wall when the power component is on;
   wherein the rear surface of a semiconductive layer including the vertical power component and the vertical detection component is coated with a metallization connected to a reference potential; and
   wherein a front surface metallization of the vertical detection component is connected to a voltage which is fixed with respect to the reference potential.

2. A state detector that detects an on or off state of a vertical power component formed in a lightly-doped semiconductor substrate of a first conductivity type having a front surface and a rear surface, in which a region corresponding to the vertical power component is surrounded with an isolating wall of opposite type to that of the substrate, the state detector being formed outside of said region and being formed with a vertical detection component, the state of which is switched by parasitic charges propagating outside of the isolating wall when the power component is on;
   wherein the state detector is formed of a vertical transistor, and the substrate forms a base of the vertical transistor.

3. The state detector of claim 2, wherein the vertical transistor includes, on a lower surface side, a deep diffused region formed at the same time as the diffusion of the lower surface isolating wall.

4. The state detector of claim 2, including several distinct vertical transistors, emitter regions of which, formed on the lower surface side of the substrate, have distinct diffusion depths.

5. A semiconductor device, comprising:
   a main switch having on and off states, formed on a substrate;
   a detector switch having on and off states, formed on the substrate; and
   an isolating wall formed on the substrate and separating the main and detector switches, wherein the state of the detector switch represents the state of the main switch in response to charge carriers permeating the isolating wall.

6. The semiconductor device of claim 5, further comprising:
   an external indicator coupled to the detector switch for indicating the state of the main switch.

7. The semiconductor device of claim 5, further comprising:
   a resistor connected between a terminal of the detector switch and a voltage supply source.

8. The semiconductor device of claim 5, wherein the main and detector switches are vertical semiconductor components.

9. The semiconductor device of claim 8, wherein the main switch is bidirectional and detector switch is unidirectional.

10. The semiconductor device of claim 9, wherein the main switch is a triac and the detector switch is a transistor.

11. A method for detecting a state of a first switch, comprising acts of:
   providing a second switch on a substrate with the first switch, wherein the second switch is separated from the first switch by an isolating wall; and
   detecting the state of the first switch with the second switch by detecting charge carriers permeating the isolating wall, wherein the state of the second switch is determined by the state of the first switch.

12. The method of claim 11, further comprising acts of:
   coupling the second switch to a resistor; and
   applying a constant voltage between the second switch and the resistor.

13. The method of claim 12, further comprising an act of:
   indicating to an operator that current is flowing through the first switch.

14. The method of claim 11, wherein the act of providing a second switch on a substrate with the first switch includes providing a second vertical power component on a substrate with a first power component.

* * * * *